US012352818B2

(12) United States Patent
Woo et al.

(10) Patent No.: US 12,352,818 B2
(45) Date of Patent: Jul. 8, 2025

(54) BATTERY MANAGEMENT APPARATUS AND METHOD

(71) Applicant: LG ENERGY SOLUTION, LTD., Seoul (KR)

(72) Inventors: Kyung-Hwa Woo, Daejeon (KR); Yoon-Jung Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/867,405

(22) PCT Filed: Jul. 11, 2023

(86) PCT No.: PCT/KR2023/009895
§ 371 (c)(1),
(2) Date: Nov. 19, 2024

(87) PCT Pub. No.: WO2024/014850
PCT Pub. Date: Jan. 18, 2024

(65) Prior Publication Data
US 2025/0116718 A1    Apr. 10, 2025

(30) Foreign Application Priority Data

Jul. 11, 2022 (KR) .......... 10-2022-0085324
Jul. 10, 2023 (KR) .......... 10-2023-0089416

(51) Int. Cl.
G01R 31/389    (2019.01)
G01R 31/374    (2019.01)
(Continued)

(52) U.S. Cl.
CPC ......... *G01R 31/389* (2019.01); *G01R 31/374* (2019.01); *G01R 31/382* (2019.01);
(Continued)

(58) Field of Classification Search
CPC ... G01R 31/389; G01R 31/374; G01R 31/382
See application file for complete search history.

(56) References Cited

U.S. PATENT DOCUMENTS

2013/0335009 A1    12/2013    Katsumata et al.
2013/0338950 A1*   12/2013    Joe .................. H01M 4/362
                                                      702/63
(Continued)

FOREIGN PATENT DOCUMENTS

CN    111751741 A    10/2020
JP    2002-042895 A    2/2002
(Continued)

*Primary Examiner* — Ricky Go
(74) *Attorney, Agent, or Firm* — Bryan Cave Leighton Paisner LLP

(57) ABSTRACT

A battery management apparatus according to an embodiment includes a side reaction determining unit configured to determine a target peak in a differential profile representing a corresponding relationship between voltage and differential capacity of a battery, and determine whether a side reaction occurs in the battery by comparing a criterion peak of a preset criterion profile with the target peak. A side reaction cause determining unit is configured to determine a resistance pattern of the battery with respect to a criterion voltage region in a resistance profile representing a corresponding relationship between voltage and resistance of the battery, and determine an occurrence cause of the side reaction based on the determined resistance pattern.

14 Claims, 9 Drawing Sheets

(51) Int. Cl.
*G01R 31/382* (2019.01)
*H01M 10/42* (2006.01)
*H01M 10/44* (2006.01)

(52) U.S. Cl.
CPC ......... *H01M 10/425* (2013.01); *H01M 10/44* (2013.01); *H01M 2010/4278* (2013.01)

(56) References Cited

U.S. PATENT DOCUMENTS

| | | | |
|---|---|---|---|
| 2014/0132222 A1* | 5/2014 | Joe | G01R 31/378 320/134 |
| 2014/0266060 A1* | 9/2014 | Ying | H02J 7/005 320/134 |
| 2014/0312910 A1 | 10/2014 | Cho et al. | |
| 2016/0061908 A1* | 3/2016 | Torai | G01R 31/3648 702/63 |
| 2017/0234930 A1 | 8/2017 | Lee et al. | |
| 2021/0053450 A1* | 2/2021 | Oh | H01M 10/44 |
| 2022/0115875 A1 | 4/2022 | Jung et al. | |
| 2023/0039356 A1 | 2/2023 | Jee et al. | |
| 2023/0140094 A1 | 5/2023 | Cha et al. | |
| 2023/0160971 A1 | 5/2023 | Cha et al. | |
| 2023/0238815 A1 | 7/2023 | Kwak et al. | |
| 2023/0280403 A1 | 9/2023 | Jeong et al. | |

FOREIGN PATENT DOCUMENTS

| | | |
|---|---|---|
| JP | 2017-133870 A | 8/2017 |
| JP | 2018-528573 A | 9/2018 |
| KR | 10-2013-0142884 A | 12/2013 |
| KR | 10-2014-0125473 A | 10/2014 |
| KR | 10-2022-0009918 A | 1/2022 |
| KR | 20220033350 A | 3/2022 |
| KR | 10-2022-0048753 A | 4/2022 |
| KR | 10-2022-0056150 A | 5/2022 |
| KR | 10-2022-0065604 A | 5/2022 |
| KR | 10-2022-0072578 A | 6/2022 |

* cited by examiner

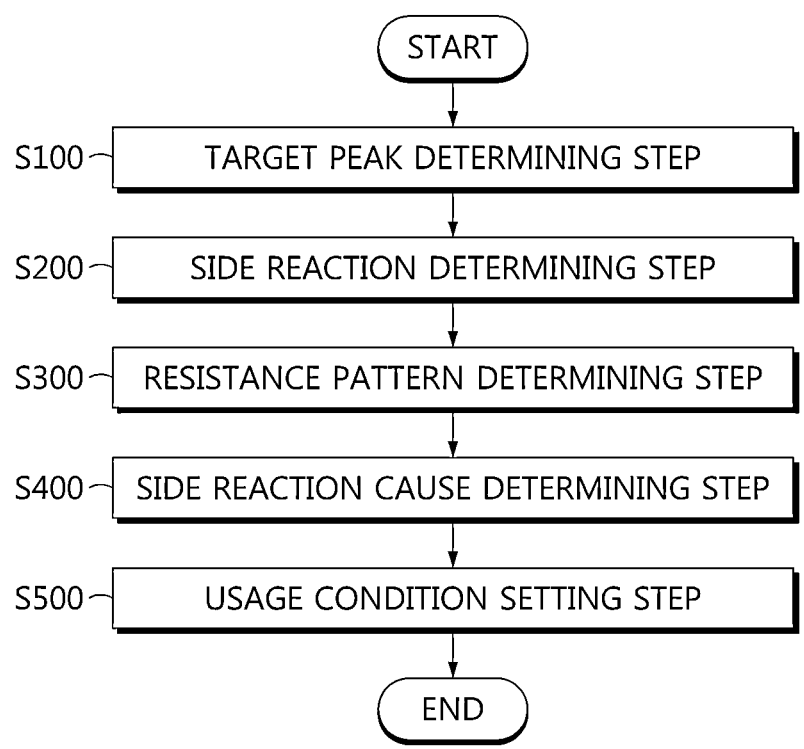

BATTERY MANAGEMENT APPARATUS AND METHOD

CROSS-REFERENCE TO RELATED APPLICATION

This application is a National Phase entry pursuant to 35 U.S.C. 371 of International Application No. PCT/KR2023/009895 filed on Nov. 7, 2023, which claims priority to and the benefit of Korean Patent Application No. 10-2022-0085324 filed on Jul. 11, 2022 and Korean Patent Application No. 10-2023-0089416 filed on Jul. 10, 2023, the disclosures of which are incorporated herein by reference in their entireties.

TECHNICAL FIELD

The present disclosure relates to a battery management apparatus and method, and to a battery management apparatus and method capable of diagnosing a state of a battery.

BACKGROUND

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

A lot of research is being conducted on these batteries in terms of increasing capacity and density, but improving lifespan and safety is also important. To achieve this, it is necessary to suppress the decomposition reaction with the electrolyte on the electrode surface and prevent overcharging and overdischarging.

In particular, it is necessary to prevent lithium precipitation on the surface of the negative electrode (lithium plating, Li-plating). When lithium is precipitated on the surface of the negative electrode, it causes a side reaction with the electrolyte and changes in the kinetic balance of the battery, which becomes a cause of battery deterioration. In addition, as lithium metal is precipitated on the surface of the negative electrode, an internal short circuit of the battery may occur, such that there is a risk of ignition or explosion due to the internal short circuit. Therefore, there is a need to develop a technology that may detect whether lithium metal is precipitated on the surface of the negative electrode.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

SUMMARY

The present disclosure is directed to solving the problems of the above, and therefore the present disclosure is directed to providing a battery management apparatus and method capable of diagnosing whether a side reaction occurs in a battery and an occurrence cause of the side reaction.

These and other aspects and advantages of the present disclosure may be understood from the following detailed description and may become more fully apparent from the exemplary embodiments of the present disclosure. Also, it will be easily understood that the aspects and advantages of the present disclosure may be realized by the means shown in the appended claims and combinations thereof.

A battery management apparatus according to one aspect of the present disclosure may comprise: a side reaction determining unit configured to determine a target peak in a differential profile representing a corresponding relationship between voltage and differential capacity of a battery, and determine whether a side reaction occurs in the battery by comparing a criterion peak of a preset criterion profile with the target peak; and a side reaction cause determining unit configured to determine a resistance pattern of the battery with respect to a criterion voltage region in a resistance profile representing a corresponding relationship between voltage and resistance of the battery, and determine an occurrence cause of the side reaction based on the determined resistance pattern.

The side reaction cause determining unit may be configured to determine the occurrence cause of the side reaction as at least one of lithium precipitation and electrolyte side reaction based on the determined resistance pattern.

The side reaction cause determining unit may be configured to determine a case in which the resistance decreases as the voltage increases in the criterion voltage region of the resistance profile as a first resistance pattern.

The side reaction cause determining unit may be configured to determine the occurrence cause of the side reaction as the lithium precipitation when the determined resistance pattern is the first resistance pattern.

The side reaction cause determining unit may be configured to determine a case in which a resistance of the resistance profile is greater than or equal to a resistance of a preset criterion resistance profile in the criterion voltage region of the resistance profile as a second resistance pattern.

The side reaction cause determining unit may be configured to determine the occurrence cause of the side reaction as the electrolyte side reaction when the determined resistance pattern is the second resistance pattern.

The battery management apparatus according to another aspect of the present disclosure may further comprise a control unit configured to set a usage condition for the battery based on the determined occurrence cause of the side reaction.

The control unit may be configured to reduce an upper limit of a charging and discharging C-rate for the battery when the occurrence cause of the side reaction is determined as the lithium precipitation.

The control unit may be configured to reduce a temperature and an upper limit state of charge (SOC) for the battery when the occurrence cause of the side reaction is determined as the electrolyte side reaction.

The side reaction determining unit may be configured to determine whether a side reaction occurs in the battery by comparing magnitudes between a voltage of the target peak and a voltage of the criterion peak.

The side reaction determining unit may be configured to determine that the side reaction occurs when the voltage of the target peak exceeds the voltage of the criterion peak.

The criterion voltage region may be configured as a voltage region containing resistances equal to or lower than a predetermined threshold resistance from a minimum resistance in the preset criterion resistance profile.

A battery pack according to another aspect of the present disclosure may comprise the battery management apparatus according to an aspect of the present disclosure.

A battery management method according to still another aspect of the present disclosure may comprise: a target peak determining step of determining a target peak in a differential profile representing a corresponding relationship between voltage and differential capacity of a battery; a side reaction determining step of determining whether a side reaction occurs in the battery by comparing a criterion peak of a preset criterion profile with the target peak; a resistance pattern determining step of determining a resistance pattern of the battery with respect to a criterion voltage region in a resistance profile representing a corresponding relationship between voltage and resistance of the battery; and a side reaction cause determining step of determining an occurrence cause of the side reaction based on the determined resistance pattern.

The battery management method according to another aspect of the present disclosure may further comprise a usage condition setting step of setting a usage condition for the battery based on the determined occurrence cause of the side reaction, after the side reaction cause determining step.

According to one aspect of the present disclosure, there is an advantage that whether a side reaction occurs in the battery and the occurrence cause of the side reaction may be specifically diagnosed.

Additionally, according to one aspect of the present disclosure, there is an advantage that the usage condition of the battery may be set to correspond to the occurrence cause of the side reaction of the battery.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure should not be construed as being limited to the drawings.

FIGS. 9 and 10 are diagrams schematically showing a battery management method according to another embodiment of the present disclosure.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description may be omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
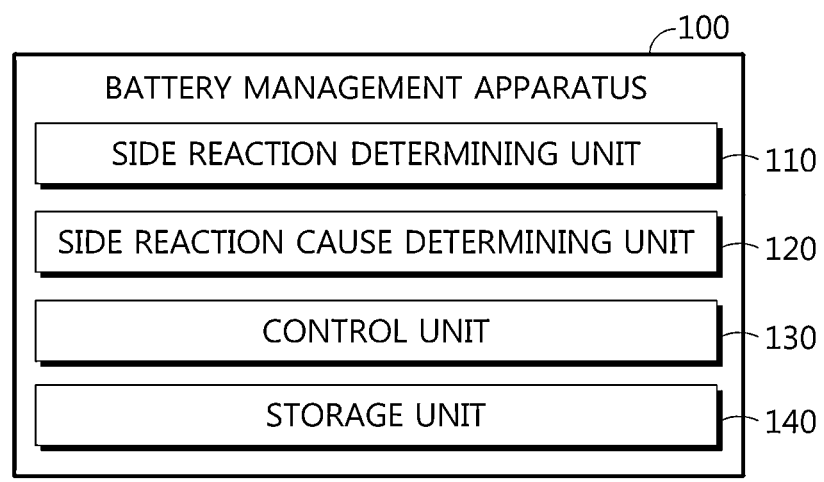
FIG. 1 is a diagram schematically showing a battery management apparatus according to an embodiment of the present disclosure.

FIG. 1 is a diagram schematically showing a battery management apparatus 100 according to an embodiment of the present disclosure.

Here, the battery may be one physically separable independent cell including a negative electrode terminal and a positive electrode terminal. For example, one lithium-ion battery or lithium polymer battery may be regarded as a battery. Additionally, the battery may be a battery module in which a plurality of cells are connected in series and/or parallel. Hereinafter, for convenience of explanation, the battery is explained as being one independent cell.

Referring to FIG. 1, the battery management apparatus 100 may include a side reaction determining unit 110 and a side reaction cause determining unit 120.

The side reaction determining unit 110 may be configured to determine a target peak in a differential profile D, which represents the corresponding relationship between voltage and differential capacity of a battery.

For example, the side reaction determining unit 110 may obtain battery information including voltage and current of the battery. The side reaction determining unit 110 may directly receive the battery information or receive it by accessing pre-stored battery information. The side reaction determining unit 110 may generate a voltage profile representing the corresponding relationship between voltage and capacity of the battery, based on the obtained battery information. Additionally, the side reaction determining unit 110 may generate a differential profile D representing the corresponding relationship between voltage and differential capacity based on the voltage profile. Here, the differential capacity is a value obtained by differentiating capacity by voltage, and may be expressed as dQ/dV.

As another example, the side reaction determining unit 110 may directly measure battery information and generate a voltage profile based on the measured battery information. Additionally, the side reaction determining unit 110 may generate the differential profile D from the voltage profile.

For example, the voltage profile may be expressed as an X-Y graph when X is set to voltage and Y is set to capacity. Also, the differential profile D may be expressed as an X-Y graph when X is set to voltage and Y is set to differential capacity.

Specifically, the side reaction determining unit 110 may determine a plurality of peaks in the differential profile D. Here, the peak may be a point that is convex upward and has a slope of 0. Preferably, the peak of the differential profile D may correspond to an inflection point of the voltage profile.

Additionally, the side reaction determining unit 110 may determine the peak with the lowest corresponding voltage among the determined plurality of peaks as the target peak. For example, the target peak may be a peak belonging in a range of 3.4 V to 3.5 V and generally expressed as Ea (1).

Figure 2:
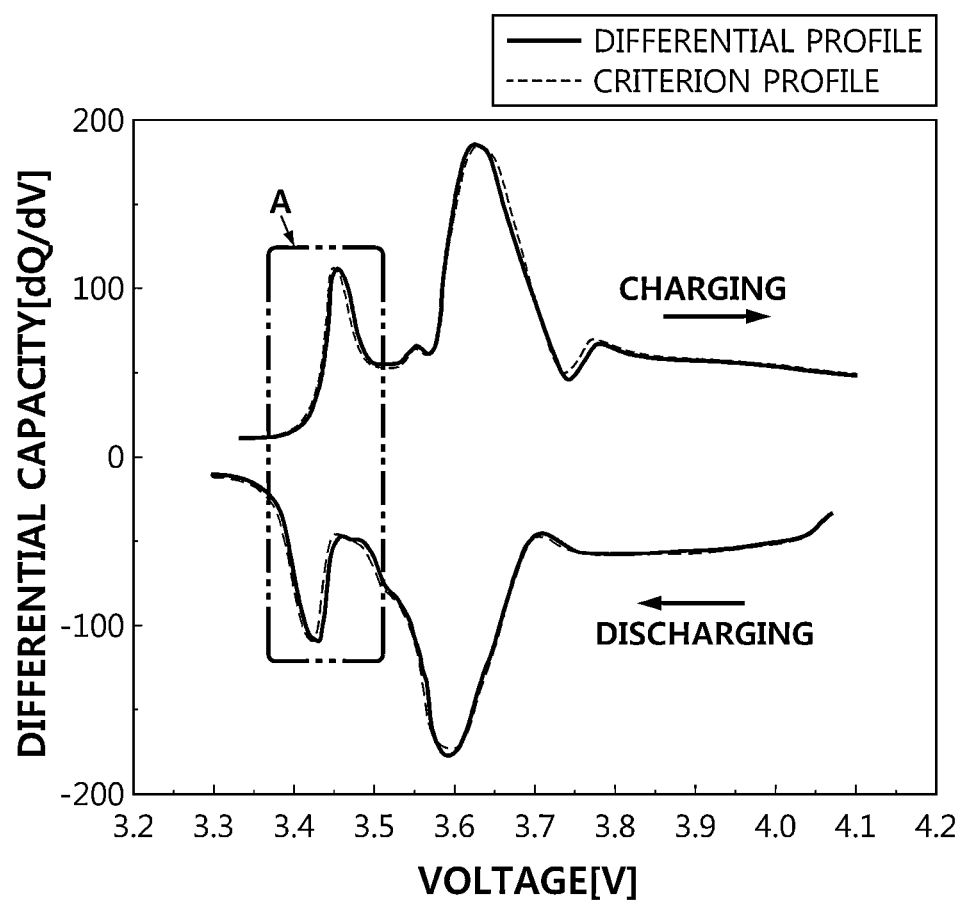
FIG. 2 is a diagram schematically showing a differential profile of a first battery according to an embodiment of the present disclosure.
Figure 3:
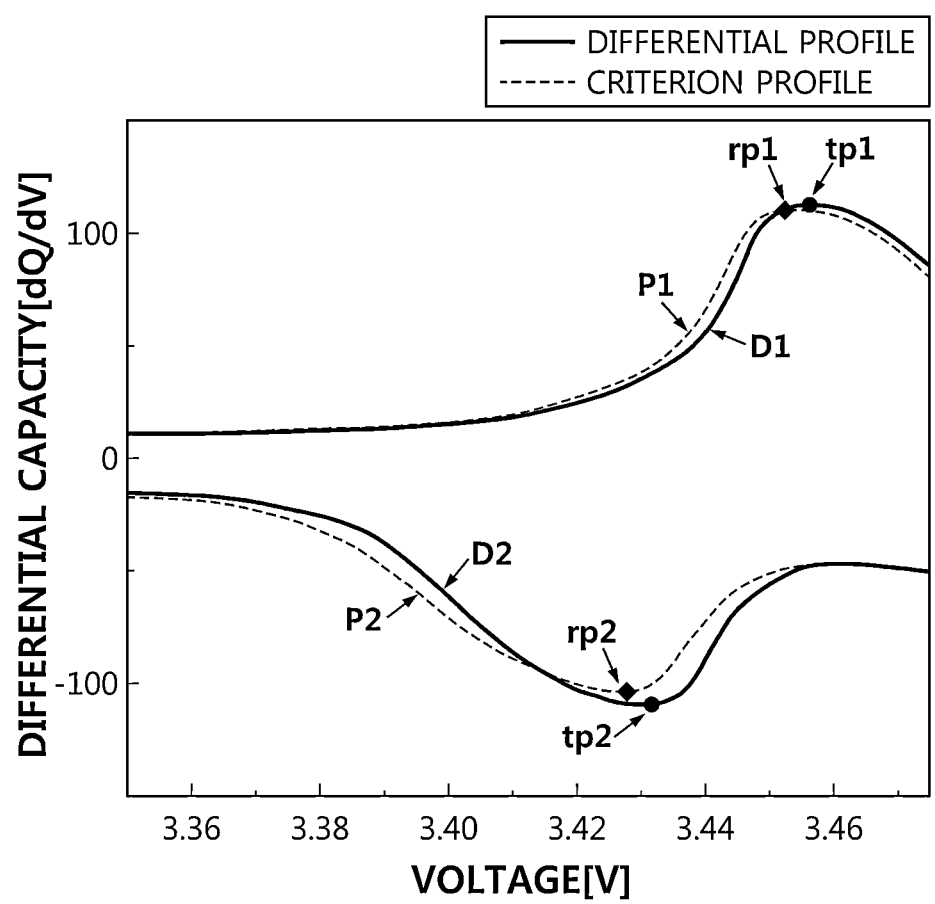
FIG. 3 is an enlarged view showing a partial region of FIG. 2.

FIG. 2 is a diagram schematically showing a differential profile D of a first battery according to an embodiment of the present disclosure. FIG. 3 is an enlarged view showing a partial region of FIG. 2. Specifically, FIG. 3 is an enlarged view showing the region A in FIG. 2.

Specifically, referring to FIGS. 2 and 3, the first criterion profile P1, the second criterion profile P2, the first differential profile D1, and the second differential profile D2 may be confirmed. Here, the first differential profile D1 is a differential profile D generated according to the battery information measured during the charging process of the first battery. The second differential profile D2 is a differential profile D generated according to the battery information measured during the discharge process of the first battery.

For example, in the embodiment of FIG. 3, the side reaction determining unit 110 may determine a first target peak tp1 in the first differential profile D1 and a second target peak tp2 in the second differential profile D2.

The side reaction determining unit 110 may be configured to determine whether a side reaction occurs in the battery by comparing a criterion peak of a preset criterion profile P and the target peak.

Here, the criterion profile P may be a profile for a criterion battery (e.g., battery in BOL (Beginning of Life) state) corresponding to the battery. Specifically, the criterion profile P may be a profile representing the corresponding relationship between voltage and differential capacity of the criterion battery.

Additionally, the criterion peak may be a peak with the lowest voltage in the criterion profile P. For example, the method of determining a target peak in the differential profile D may be applied as is to determine a criterion peak in the criterion profile P.

For example, in the embodiment of FIGS. 2 and 3, the first criterion profile P1 may correspond to the first differential profile D1, and the second criterion profile P2 may correspond to the second differential profile D2. The first criterion profile P1 may include a first criterion peak rp1, and the second criterion profile P2 may include a second criterion peak rp2.

The side reaction determining unit 110 may determine whether a side reaction occurs in the battery by comparing the first target peak tp1 and the first criterion peak rp1. Additionally, the side reaction determining unit 110 may determine whether a side reaction occurs by comparing the second target peak tp2 and the second criterion peak rp2. That is, although both the differential profile D and the criterion profile P corresponding to charging and discharging of the battery are shown in FIGS. 2 and 3, the side reaction determining unit 110 may determine whether a side reaction occurs in at least one of the charging and discharging states of the battery.

Specifically, the side reaction determining unit 110 may be configured to determine whether a side reaction occurs in the battery by comparing the magnitudes between the voltage of the target peak and the voltage of the criterion peak.

For example, in the embodiment of FIG. 3, the side reaction determining unit 110 may compare the voltages of the first target peak tp1 and the first criterion peak rp1. The side reaction determining unit 110 may determine that the voltage of the first target peak tp1 is greater than the voltage of the first criterion peak rp1.

As another example, in the embodiment of FIG. 3, the side reaction determining unit 110 may compare the voltages of the second target peak tp2 and the second criterion peak rp2. The side reaction determining unit 110 may determine that the voltage of the second target peak tp2 is greater than the voltage of the second criterion peak rp2.

The side reaction determining unit 110 may be configured to determine that a side reaction has occurred when the voltage of the target peak exceeds the voltage of the criterion peak. Conversely, the side reaction determining unit 110 may determine that no side reaction has occurred if the voltage of the target peak is less than or equal to the voltage of the criterion peak.

Initially, the target peak and the criterion peak of the battery may be the same. However, if a side reaction occurs in the battery, the target peak (Ea (1) peak) that appears in the differential profile D of the battery may be shifted to a high potential. Specifically, when available lithium of the battery is lost, the target peak may shift to a higher potential. For example, if lithium metal precipitates on the surface of the negative electrode of the battery or a side reaction of electrolyte occurs, available lithium in the battery may be lost. Also, because of this, the target peak that appears in the differential profile D of the battery may be shifted to a higher potential than the criterion peak. Therefore, the side reaction determining unit 110 may determine whether a side reaction has occurred in the battery by comparing the voltage of the target peak and the voltage of the criterion peak.

For example, in the embodiment of FIG. 3, because the voltage of the first target peak tp1 exceeds the voltage of the first criterion peak rp1, the side reaction determining unit 110 may determine that a side reaction has occurred in the first battery.

As another example, in the embodiment of FIG. 3, because the voltage of the second target peak tp2 exceeds the voltage of the second criterion peak rp2, the side reaction determining unit 110 may determine that a side reaction has occurred in the first battery.

As still another example, in the embodiment of FIG. 3, because the voltage of the first target peak tp1 exceeds the voltage of the first criterion peak rp1 and the voltage of the second target peak tp2 exceeds the voltage of the second criterion peak rp2, the side reaction determining unit 110 may determine that a side reaction has occurred in the first battery.

The side reaction cause determining unit 120 may be configured to determine a resistance pattern of the battery with respect to a criterion voltage region RR in the resistance profile representing the corresponding relationship between voltage and resistance of the battery.

Figure 4:
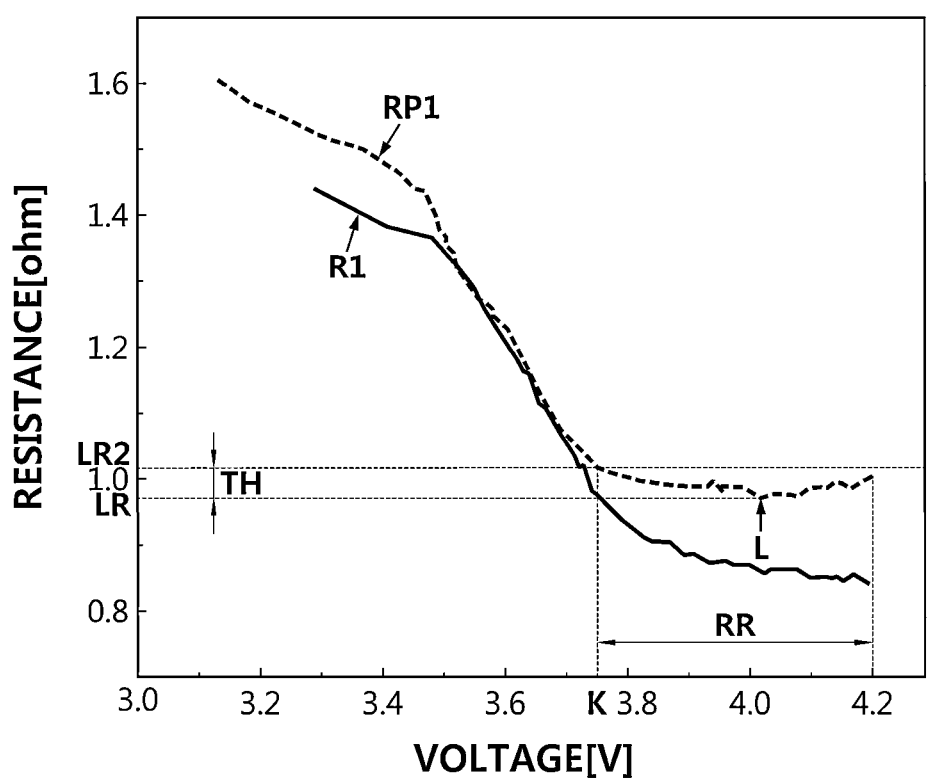
FIG. 4 is a diagram schematically showing a resistance profile of the first battery according to an embodiment of the present disclosure.

FIG. 4 is a diagram schematically showing a resistance profile of the first battery according to an embodiment of the present disclosure.

For example, the resistance profile may be expressed as an X-Y graph when X is set to voltage and Y is set to resistance. Specifically, FIG. 4 is a diagram showing the first resistance profile R1 and the first criterion resistance profile RP1 for the battery.

The side reaction cause determining unit 120 may select the resistance corresponding to the criterion voltage region RR in the resistance profile in order to determine the resistance pattern of the battery. Also, the side reaction cause determining unit 120 may determine the pattern between the selected plurality of resistances.

For example, the criterion voltage region may be a voltage region preset according to the resistance change rate based on the voltage in the criterion resistance profile. In the embodiment of FIG. 4, it can be seen that the resistance change rate with respect to voltage changes rapidly based on the K voltage. For example, when calculating the difference between the resistance change rates immediately before and immediately after each voltage included in the criterion resistance profile, the difference in resistance change rate corresponding to the K voltage (the difference in resistance change rate immediately before and immediately after the K voltage) may be the largest. Therefore, the criterion voltage region RR may be set to a voltage region corresponding to 4.2 [V] from K voltage. In other words, the criterion voltage region RR may be a region in the criterion resistance profile where the change in resistance according to voltage is small. In other words, the criterion voltage region RR may be a resistance flat region included in the criterion resistance profile.

As another example, the criterion voltage region RR may be configured as a voltage region that includes resistances equal to or less than a predetermined threshold resistance TH from the minimum resistance in the preset criterion resistance profile. In the embodiment of FIG. 4, the minimum resistance in the first criterion resistance profile RP1 may be LR corresponding to the L point. Also, LR2 may be a value obtained by adding the threshold resistance TH to the minimum resistance LR. For example, the threshold resistance TH may be preset to a value of 0.1 ($\Omega$) or less. Preferably, the threshold resistance TH may be preset to a value of 0.05 ($\Omega$) or less.

The criterion voltage region RR may be defined as a voltage region greater than or equal to the voltage value corresponding to the LR2 resistance among all voltage regions. Here, when a plurality of voltage values correspond to the LR2 resistance, the criterion voltage region RR may be set based on the lowest voltage value among the plurality of voltage values.

In the embodiment of FIG. 4, the resistance corresponding to the voltage from K [V] to 4.2 [V] may be included within the threshold resistance TH from the minimum resistance LR. Therefore, the criterion voltage region RR may be preset to K [V] to 4.2 [V]. Additionally, the side reaction cause determining unit 120 may determine the resistance pattern between the plurality of resistances corresponding to the criterion voltage region of the resistance profile.

The side reaction cause determining unit 120 may be configured to determine the case in which resistance decreases as voltage increases in the criterion voltage region RR of the resistance profile as a first resistance pattern. Additionally, the side reaction cause determining unit 120 may be configured to determine the case in which the resistance of the resistance profile is greater than or equal to the resistance of the preset criterion resistance profile in the criterion voltage region RR of the resistance profile as a second resistance pattern.

Here, it should be noted that the first resistance pattern and the second resistance pattern are not opposing resistance patterns. In other words, the resistance pattern of the battery may be determined as the first resistance pattern and the second resistance pattern. For example, if both the first condition that the resistance decreases as the voltage increases in the criterion voltage region RR of the resistance profile and the second condition that the resistance of the criterion voltage region RR of the resistance profile is greater than or equal to the resistance of the criterion voltage region RR in the criterion resistance profile are satisfied, the resistance pattern of the battery may be determined as the first resistance pattern and the second resistance pattern.

In the embodiment of FIG. 4, looking at the criterion voltage region RR of the first resistance profile R1, since the resistance decreases as the voltage increases, the side reaction cause determining unit 120 may determine the resistance pattern for the first battery as the first resistance pattern.

The side reaction cause determining unit 120 may be configured to determine the occurrence cause of the side reaction based on the determined resistance pattern.

Specifically, the side reaction cause determining unit 120 may be configured to determine the occurrence cause of the side reaction as at least one of lithium precipitation and electrolyte side reaction based on the determined resistance pattern.

Here, lithium precipitation may be that lithium ions contained in the battery are precipitated into metallic lithium on the surface of the negative electrode.

Also, electrolyte side reaction may be that a side reaction occurs in electrolyte (electrolytic solution) to deteriorate the performance of the battery. For example, electrolyte side reaction may refer to a side reaction that occurs in electrolyte due to negative electrode reduction.

The side reaction cause determining unit 120 may specifically determine the occurrence cause of the side reaction for the battery in which it has been determined that the side reaction has occurred. In other words, the cause of the loss of available lithium in the battery may be determined as at least one of lithium precipitation and electrolyte side reaction.

For example, the side reaction cause determining unit 120 may be configured to determine the occurrence cause of the side reaction as lithium precipitation, when the determined resistance pattern is the first resistance pattern. Conversely, the side reaction cause determining unit 120 may be configured to determine the occurrence cause of the side reaction as electrolyte side reaction, when the determined resistance pattern is the second resistance pattern.

In the embodiment of FIG. 4, the resistance pattern for the first battery may be determined as the first resistance pattern. Therefore, the side reaction cause determining unit 120 may determine the side reaction occurrence cause of the first battery as lithium precipitation. In other words, the first battery may be a battery in which available lithium has been lost due to lithium plating (Li-plating), in which lithium metal precipitates on the surface of the negative electrode.

The battery management apparatus 100 according to an embodiment of the present disclosure has an advantage of specifically diagnosing not only whether a side reaction occurs in the battery but also the occurrence cause of side reaction. Therefore, if the battery management apparatus 100 is used, an abnormal battery (particularly, a battery in which a side reaction has occurred) may be quickly detected, and the occurrence cause of the side reaction may also be detected together.

Below, an embodiment of a second battery will be described.

Figure 5:
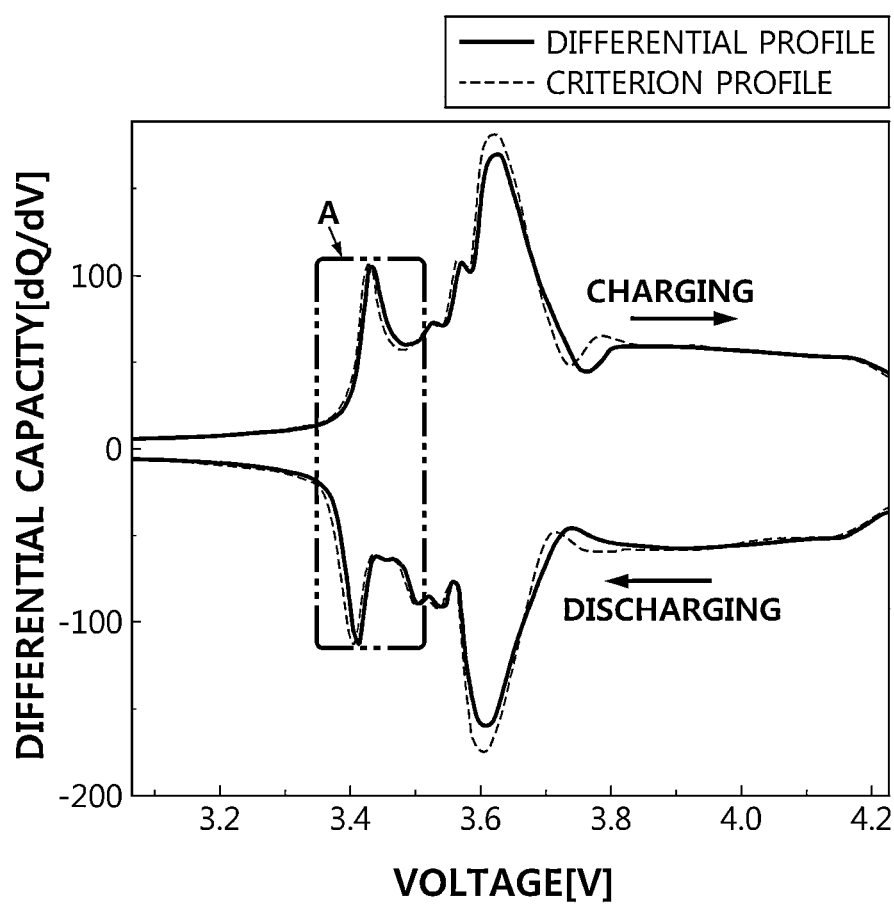
FIG. 5 is a diagram schematically showing a differential profile of a second battery according to an embodiment of the present disclosure.
Figure 6:
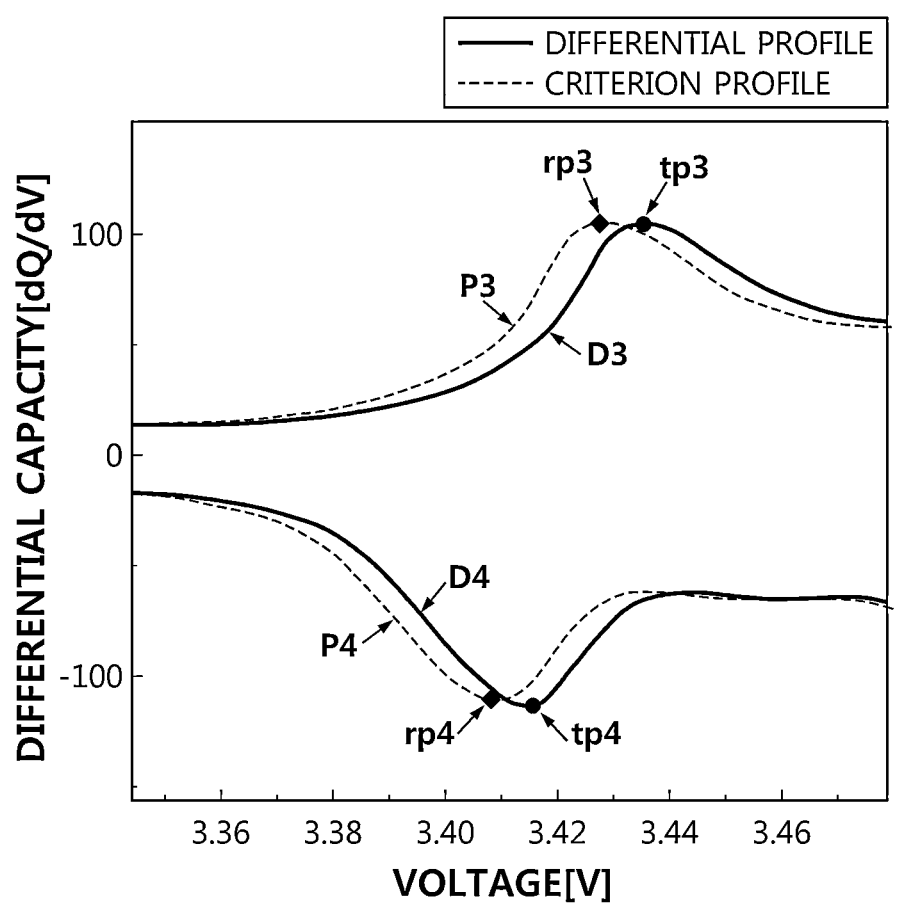
FIG. 6 is an enlarged view showing a partial region of FIG. 5.

FIG. 5 is a diagram schematically showing a differential profile D of the second battery according to an embodiment of the present disclosure. FIG. 6 is an enlarged view showing a partial region of FIG. 5. Specifically, FIG. 6 is an enlarged view showing the region A in FIG. 5.

Specifically, FIGS. 5 and 6 show a third differential profile D3, a fourth differential profile D4, a third criterion profile P3, and a fourth criterion profile P4 for the second battery. Here, the third criterion profile P3 may correspond to the third differential profile D3, and the fourth criterion profile P4 may correspond to the fourth differential profile D4. Also, the third differential profile D3 is a differential profile D generated according to the battery information measured during the charging process of the second battery. The fourth differential profile D4 is a differential profile D generated according to the battery information measured during the discharge process of the second battery.

For example, the side reaction determining unit 110 may determine the third target peak tp3 in the third differential profile D3. Also, because the voltage of the third target peak tp3 is greater than the voltage of the third criterion peak rp3, the side reaction determining unit 110 may determine that a side reaction has occurred in the second battery.

As another example, the side reaction determining unit 110 may determine the fourth target peak tp4 in the fourth differential profile D4. Also, because the voltage of the fourth target peak tp4 is greater than the voltage of the fourth criterion peak rp4, the side reaction determining unit 110 may determine that a side reaction has occurred in the second battery.

As still another example, because the voltage of the third target peak tp3 is greater than the voltage of the third criterion peak rp3 and the voltage of the fourth target peak tp4 is greater than the voltage of the fourth criterion peak rp4, the side reaction determining unit 110 may determine that a side reaction has occurred in the second battery.

Figure 7:
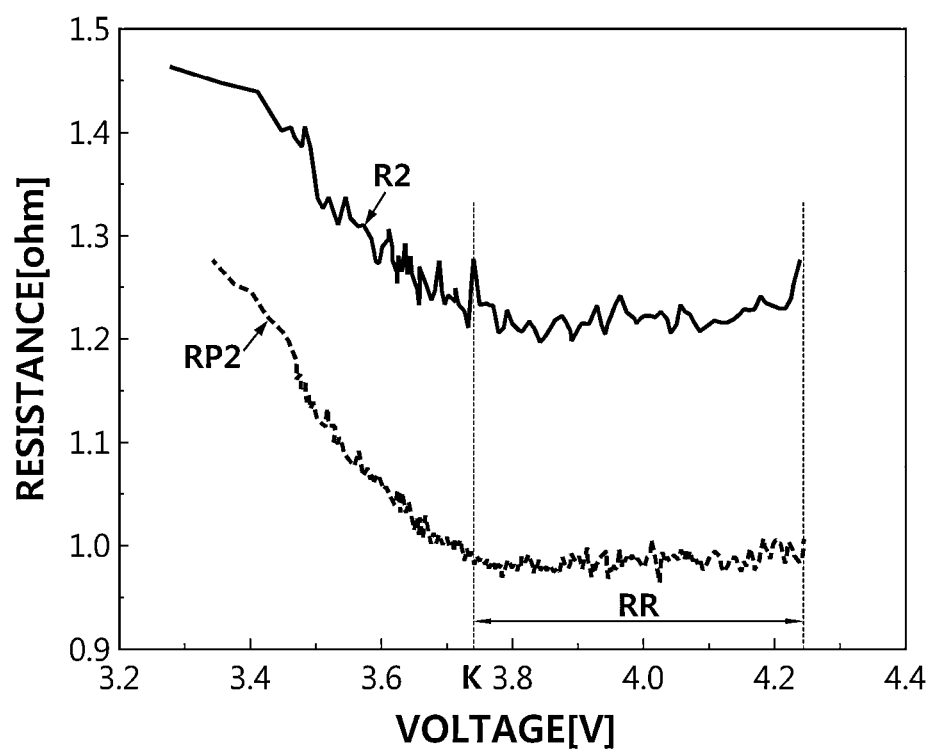
FIG. 7 is a diagram schematically showing a resistance profile of the second battery according to an embodiment of the present disclosure.

FIG. 7 is a diagram schematically showing a resistance profile of the second battery according to an embodiment of the present disclosure. Specifically, FIG. 7 is a diagram showing the second resistance profile R2 and the second criterion resistance profile rp2 for the second battery.

In the embodiment of FIG. 7, looking at the criterion voltage region RR of the second resistance profile R2, since the resistance is maintained in a certain range even if the voltage increases, the side reaction cause determining unit 120 may determine the resistance pattern for the second battery as the second resistance pattern. In other words, since the resistance does not decrease even if the voltage increases in the criterion voltage region RR of the second resistance profile R2, the side reaction cause determining unit 120 may determine the resistance pattern for the second battery as the second resistance pattern. Therefore, the side reaction cause determining unit 120 may determine the side reaction occurrence cause of the second battery as electrolyte side reaction.

Referring to FIG. 1, the battery management apparatus 100 according to an embodiment of the present disclosure may further include a control unit 130.

The control unit 130 may be configured to set a usage condition for the battery based on the determined occurrence cause of the side reaction.

Specifically, the usage condition for the battery may be set in advance for charging and discharging C-rate (Current rate), temperature range, and SOC (State of charge) available range. For example, the usage conditions for charging C-rate according to charging type (slow charging and fast charging) of the battery, discharging C-rate for output required by the load, upper limit temperature, lower limit temperature, upper limit SOC, lower limit SOC, and the like may be set in advance. These battery usage conditions may be set in advance in consideration of the battery type, the area where the battery is used, and the like.

Preferably, the control unit 130 may change and set the usage condition of the battery according to the occurrence cause of the side reaction. Specifically, the control unit 130 may change and set the usage condition of the battery depending on the cause of loss of available lithium.

Specifically, when the occurrence cause of the side reaction is determined as lithium precipitation, the control unit 130 may set the usage condition of the battery so that the lithium precipitation reaction may be suppressed. For example, the control unit 130 may be configured to reduce the upper limit of the charging and discharging C-rate for the battery, when the occurrence cause of the side reaction is determined as lithium precipitation.

Additionally, when the occurrence cause of the side reaction is determined as electrolyte side reaction, the control unit 130 may set the usage condition of the battery so that the electrolyte decomposition reaction may be suppressed. For example, the control unit 130 may be configured to reduce the temperature and the upper limit SOC for the battery, when the occurrence cause of the side reaction is determined as electrolyte side reaction.

In addition, when the occurrence cause of the side reaction is determined as lithium precipitation and electrolyte side reaction, the control unit 130 may set the usage conditions of the battery so that the lithium precipitation reaction may be suppressed and electrolyte decomposition on the precipitated lithium metal surface may be suppressed. For example, the control unit 130 may be configured to reduce the upper limit of the charging and discharging C-rate, temperature, and upper limit SOC for the battery when the occurrence cause of the side reaction is determined as lithium precipitation and electrolyte side reaction.

In other words, the battery management apparatus 100 according to an embodiment of the present disclosure has an advantage of preventing further side reactions from occurring in the battery and causing the side reaction to lose its activity by setting the usage condition of the battery to correspond to the occurrence cause of the side reaction. Therefore, there is an advantage in ultimately increasing the lifespan of the battery. In addition, there is an advantage that unexpected accidents such as fire and explosion may be prevented.

Meanwhile, the battery may be charged at a low rate or discharged at a low rate. Specifically, the battery may be charged or discharged under low C-rate conditions below a preset criterion C-rate.

For example, the battery may be charged or discharged at a C-rate equal to or lower than a predetermined rate in the criterion C-rate. Here, assuming that the criterion C-rate is 1 C and the predetermined rate is 0.2, the battery may be charged or discharged at a C-rate of 0.2 C or less.

The criterion C-rate may be initially set considering the BOL (Beginning of life) status of the battery. Additionally, the criterion C-rate may be changed in the process where the control unit 130 changes the upper limit of the charging and discharging C-rate.

In this way, a battery that has been charged at a low rate or discharged at a low rate may be a diagnostic target in which it is easy to determine whether a side reaction has occurred just by the behavior of the target peak. Therefore, the side reaction determining unit 110 may determine that a side reaction has occurred, when the voltage of the target peak exceeds the voltage of the criterion peak for a low-rate charged or low-rate discharged battery.

Meanwhile, the side reaction determining unit 110, the side reaction cause determining unit 120 and the control unit 130 provided in the battery management apparatus 100 may selectively include processors known in the art, application-specific integrated circuits (ASICs), other chipsets, logic circuits, registers, communication modems, data processing devices, and the like to execute various control logic performed in the present disclosure. Also, when the control logic is implemented in software, the side reaction determining unit 110, the side reaction cause determining unit 120 and the control unit 130 may be implemented as a set of program modules. At this time, the program module may be stored in a memory and executed by the side reaction determining unit 110, the side reaction cause determining unit 120 and the control unit 130. The memory may be located inside or out of the side reaction determining unit 110, the side reaction cause determining unit 120 and the control unit 130 and may be connected to the side reaction determining unit 110, the side reaction cause determining unit 120 and the control unit 130 by various well-known means.

In addition, the battery management apparatus 100 may further include a storage unit 140. The storage unit 140 may store data necessary for operation and function of each component of the battery management apparatus 100, data generated in the process of performing the operation or function, or the like. The storage unit 140 is not particularly limited in its type as long as it is a known information storage means that can record, erase, update and read data. As an example, the information storage means may include RAM, flash memory, ROM, EEPROM, registers, and the like. In addition, the storage unit 140 may store program codes in which processes executable by each component of the battery management apparatus 100 are defined.

For example, the storage unit 140 may store the criterion profile P, the differential profile D, the criterion resistance profile, and the resistance profile. Additionally, the storage unit 140 may store the usage condition preset for the battery and the usage condition changed by the control unit 130.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in a conventional BMS. For example, the side reaction determining unit 110, the side reaction cause determining unit 120, the control unit 130 and the storage unit 140 may be implemented as components of the BMS.

The battery management apparatus 100 according to the present disclosure may be provided in a battery pack. That is, the battery pack according to the present disclosure may include the above-described battery management apparatus 100 and one or more battery cells. In addition, the battery pack may further include electrical equipment (relays, fuses, etc.) and a case.

Figure 8:
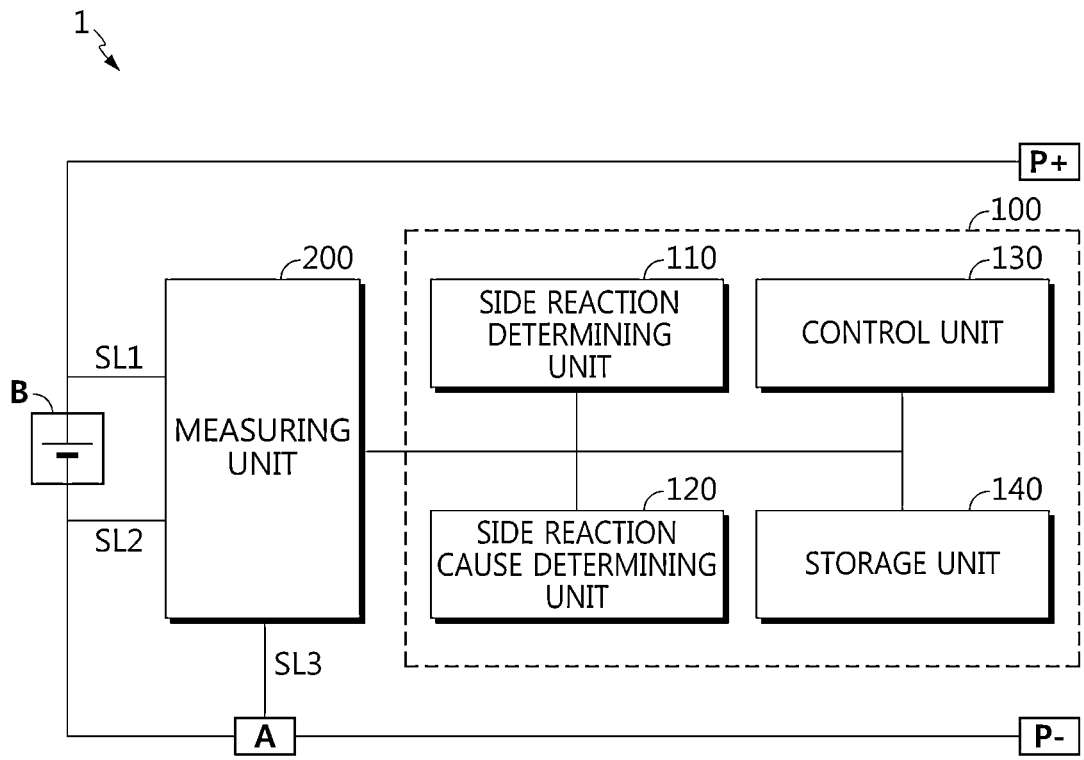
FIG. 8 is a diagram schematically showing an exemplary configuration of a battery pack according to another embodiment of the present disclosure.

FIG. 8 is a diagram schematically showing an exemplary configuration of a battery pack 1 according to another embodiment of the present disclosure.

The positive electrode terminal of a battery B may be connected to the positive electrode terminal P+ of the battery pack 1, and the negative electrode terminal of the battery B may be connected to the negative electrode terminal P− of the battery pack 1.

A measuring unit 200 may be connected to a first sensing line SL1, a second sensing line SL2, and a third sensing line SL3. Specifically, the measuring unit 200 may be connected to a positive electrode terminal of the battery B through the first sensing line SL1, and may be connected to a negative electrode terminal of the battery B through the second sensing line SL2. The measuring unit 200 may measure the voltage of the battery B based on the voltage measured at each of the first sensing line SL1 and the second sensing line SL2.

In addition, the measuring unit 200 may be connected to an ampere meter A through the third sensing line SL3. For example, the ampere meter A may be an ammeter or a shunt resistor capable of measuring the charging current and the discharging current of the battery B. The measuring unit 200 may calculate the charge amount by measuring the charging current of the battery B through the third sensing line SL3. Also, the measuring unit 200 may calculate the discharge amount by measuring the discharge current of the battery B through the third sensing line SL3.

One end of an external device may be connected to the positive electrode terminal P+ of the battery pack 1, and the other end may be connected to the negative electrode terminal P− of the battery pack 1. Therefore, the positive electrode terminal of the battery B, the positive electrode terminal P+ of the battery pack 1, the external device, the negative electrode terminal P− of the battery pack 1, and the negative electrode terminal of the battery B may be electrically connected. For example, the external device may be a charging and discharging device, or a motor of an electric vehicle that receives power from the battery B.

Figure 9:
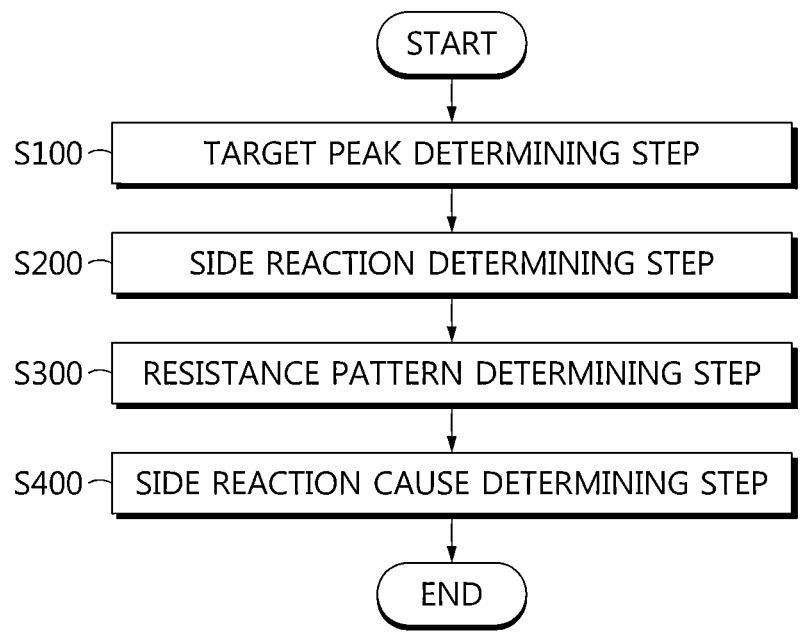

FIGS. 9 and 10 are diagrams schematically showing a battery management method according to another embodiment of the present disclosure.

Referring to FIG. 9, the battery management method may include a target peak determining step (S100), a side reaction determining step (S200), a resistance pattern determining step (S300), and a side reaction cause determining step (S400).

Preferably, each step of the battery management method may be performed by the battery management apparatus 100. Hereinafter, for convenience of explanation, contents overlapping with the previously described contents may be omitted or briefly described.

The peak target determining step (S100) is a step of determining a target peak in a differential profile D, which represents the corresponding relationship between voltage and differential capacity of the battery, and may be performed by the side reaction determining unit 110.

Specifically, the side reaction determining unit 110 may determine a peak corresponding to the lowest voltage among the plurality of peaks included in the differential profile D as the target peak.

Referring to the first differential profile D1 of FIGS. 2 and 3, the side reaction determining unit 110 may determine the first target peak tp1 among the plurality of peaks included in the first differential profile D1.

The side reaction determining step (S200) is a step of determining whether a side reaction occurs in the battery by comparing a criterion peak of a preset criterion profile P and the target peak, and may be performed by the side reaction determining unit 110.

Specifically, the side reaction determining unit 110 may compare the voltages between the target peak of the differential profile D and the criterion peak of the criterion profile P. Additionally, the side reaction determining unit 110 may determine that a side reaction has occurred in the battery when the voltage of the target peak exceeds the voltage of the criterion peak.

Referring to the first differential profile D1 of FIGS. 2 and 3, the voltage of the first target peak tp1 may exceed the voltage of the first criterion peak rp1. Therefore, the side reaction determining unit 110 may determine that a side reaction has occurred in the first battery.

The resistance pattern determining step (S300) is a step of determining a resistance pattern of the battery with respect to the criterion voltage region RR in the resistance profile representing the corresponding relationship between voltage and resistance of the battery, and may be performed by the side reaction cause determining unit 120.

Specifically, the side reaction cause determining unit 120 may determine the resistance pattern of the battery as a first resistance pattern and/or a second resistance pattern based on the change in resistance according to voltage in the criterion voltage region RR of the resistance profile.

Here, the first resistance pattern is a pattern in which resistance decreases as the voltage increases, and the second resistance pattern is a pattern in which the resistance of the resistance profile is greater than or equal to the resistance of the criterion resistance profile in the criterion voltage region RR.

Referring to the first resistance profile R1 in FIG. 4, since the resistance decreases as the voltage increases in the criterion voltage region RR, the side reaction cause determining unit 120 may determine the resistance pattern of the first battery as the first resistance pattern.

The side reaction cause determining step (S400) is a step of determining the occurrence cause of the side reaction based on the determined resistance pattern, and may be performed by the side reaction cause determining unit 120.

Specifically, the side reaction cause determining unit 120 may determine the occurrence cause of the side reaction as lithium precipitation and/or electrolyte side reaction according to the resistance pattern of the battery.

For example, the side reaction cause determining unit 120 may determine the occurrence cause of the side reaction as lithium precipitation if the resistance pattern of the battery is the first resistance pattern.

As another example, the side reaction cause determining unit 120 may determine the occurrence cause of the side reaction as electrolyte side reaction if the resistance pattern of the battery is the second resistance pattern.

As still another example, the side reaction cause determining unit 120 may determine the occurrence cause of the side reaction as lithium precipitation and electrolyte side reaction if the resistance pattern of the battery is the first resistance pattern and the second resistance pattern.

Referring to FIG. 10, the battery management method may further include a usage condition setting step (S500) after the side reaction cause determining step (S400).

The usage condition setting step (S500) is a step of setting the usage condition for the battery based on the determined occurrence cause of the side reaction, and may be performed by the control unit 130.

Specifically, the control unit 130 may set the battery usage condition differently depending on the occurrence cause of the side reaction.

For example, the control unit 130 may be configured to reduce the upper limit of the charging and discharging C-rate for the battery, when the occurrence cause of the side reaction is determined as lithium precipitation.

As another example, the control unit 130 may be configured to reduce the temperature and the upper limit SOC for the battery, when the occurrence cause of the side reaction is determined as electrolyte side reaction.

As still another example, the control unit 130 may be configured to reduce the upper limit of the charging and discharging C-rate, temperature, and upper limit SOC for the battery, when the occurrence cause of the side reaction is determined as lithium precipitation and electrolyte side reaction.

The embodiments of the present disclosure described above may not be implemented only through an apparatus and a method, but may be implemented through a program that realizes a function corresponding to the configuration of the embodiments of the present disclosure or a recording medium on which the program is recorded. The recording medium may be a non-transitory recording medium such as RAM, flash memory, ROM, EEPROM, registers, and the like. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A battery management apparatus, comprising:
 a side reaction determining unit configured to determine a target peak in a differential profile representing a corresponding relationship between voltage and differential capacity of a battery, and determine whether a side reaction occurs in the battery by comparing a criterion peak of a preset criterion profile with the target peak; and
 a side reaction cause determining unit configured to determine a resistance pattern of the battery with respect to a criterion voltage region in a resistance profile representing a corresponding relationship between voltage and resistance of the battery, and determine an occurrence cause of the side reaction based on the determined resistance pattern, wherein diagnostic information on the occurrence and cause of the side reaction is used in setting operating conditions of the battery.

2. The battery management apparatus according to claim 1, wherein the side reaction cause determining unit is configured to determine the occurrence cause of the side reaction as at least one of lithium precipitation and electrolyte side reaction based on the determined resistance pattern.

3. The battery management apparatus according to claim 2, wherein the side reaction cause determining unit is configured to determine a case in which the resistance decreases as the voltage increases in the criterion voltage region of the resistance profile as a first resistance pattern.

4. The battery management apparatus according to claim 3, wherein the side reaction cause determining unit is configured to determine the occurrence cause of the side reaction as the lithium precipitation when the determined resistance pattern is the first resistance pattern.

5. The battery management apparatus according to claim 2, wherein the side reaction cause determining unit is configured to determine a case in which a resistance of the resistance profile is greater than or equal to a resistance of a preset criterion resistance profile in the criterion voltage region of the resistance profile as a second resistance pattern.

6. The battery management apparatus according to claim 5, wherein the side reaction cause determining unit is configured to determine the occurrence cause of the side reaction as the electrolyte side reaction when the determined resistance pattern is the second resistance pattern.

7. The battery management apparatus according to claim 2, further comprising:

a control unit configured to set a usage condition for the battery based on the determined occurrence cause of the side reaction.

8. The battery management apparatus according to claim 7, wherein the control unit is configured to reduce an upper limit of a charging and discharging C-rate for the battery when the occurrence cause of the side reaction is determined as the lithium precipitation, and the control unit is configured to reduce a temperature and an upper limit state of charge (SOC) for the battery when the occurrence cause of the side reaction is determined as the electrolyte side reaction.

9. The battery management apparatus according to claim 1, wherein the side reaction determining unit is configured to determine whether a side reaction occurs in the battery by comparing magnitudes between a voltage of the target peak and a voltage of the criterion peak.

10. The battery management apparatus according to claim 9, wherein the side reaction determining unit is configured to determine that the side reaction occurs when the voltage of the target peak exceeds the voltage of the criterion peak.

11. The battery management apparatus according to claim 1, wherein the criterion voltage region is configured as a voltage region containing resistances equal to or lower than a predetermined threshold resistance from a minimum resistance in a preset criterion resistance profile.

12. A battery pack, comprising the battery management apparatus according to claim 1.

13. A battery management method, comprising:

a target peak determining step of determining a target peak in a differential profile representing a corresponding relationship between voltage and differential capacity of a battery;

a side reaction determining step of determining whether a side reaction occurs in the battery by comparing a criterion peak of a preset criterion profile with the target peak;

a resistance pattern determining step of determining a resistance pattern of the battery with respect to a criterion voltage region in a resistance profile representing a corresponding relationship between voltage and resistance of the battery; and a side reaction cause determining step of determining an occurrence cause of the side reaction based on the determined resistance pattern, wherein diagnostic information on the occurrence and cause of the side reaction is used in setting operating conditions of the battery.

14. The battery management method according to claim 13, further comprising:

a usage condition setting step of setting a usage condition for the battery based on the determined occurrence cause of the side reaction, after the side reaction cause determining step.

* * * * *